(12) United States Patent
Koseki et al.

(10) Patent No.: US 9,240,537 B2
(45) Date of Patent: Jan. 19, 2016

(54) LIGHT-EMITTING DEVICE INCLUDING CASE AND SEALANT

(71) Applicant: Toyoda Gosei Co., Ltd., Kiyosu-shi (JP)

(72) Inventors: Masakata Koseki, Kiyosu (JP); Yuichi Yano, Kiyosu (JP); Akio Namiki, Kiyosu (JP)

(73) Assignee: TOYODA GOSEI CO., LTD., Kiyosu-shi, Aichi-Ken (JP)

( * ) Notice: Subject to any disclaimer, the term of this patent is extended or adjusted under 35 U.S.C. 154(b) by 0 days.

(21) Appl. No.: 14/074,639

(22) Filed: Nov. 7, 2013

(65) Prior Publication Data

US 2014/0131756 A1    May 15, 2014

(30) Foreign Application Priority Data

Nov. 9, 2012 (JP) .................. 2012-247077
Sep. 17, 2013 (JP) .................. 2013-191606

(51) Int. Cl.

| H01L 27/15 | (2006.01) |
| --- | --- |
| H01L 29/267 | (2006.01) |
| H01L 31/12 | (2006.01) |
| H01L 33/00 | (2010.01) |
| H01L 31/0203 | (2014.01) |
| H01L 23/28 | (2006.01) |
| H01L 23/29 | (2006.01) |
| H01L 33/64 | (2010.01) |
| H01L 33/44 | (2010.01) |
| H01L 33/48 | (2010.01) |
| H01L 21/673 | (2006.01) |
| H01L 33/52 | (2010.01) |
| H01L 23/02 | (2006.01) |
| H01L 33/56 | (2010.01) |

(52) U.S. Cl.
CPC .......... *H01L 33/641* (2013.01); *H01L 21/67376* (2013.01); *H01L 23/02* (2013.01); *H01L 23/28* (2013.01); *H01L 31/0203* (2013.01); *H01L 33/44* (2013.01); *H01L 33/48* (2013.01); *H01L 33/483* (2013.01); *H01L 33/52* (2013.01); *H01L 33/56* (2013.01); *H01L 2924/12041* (2013.01); *H01L 2924/181* (2013.01); *H01L 2924/183* (2013.01); *H01L 2924/186* (2013.01)

(58) Field of Classification Search
CPC ....... H01L 33/44; H01L 33/48; H01L 33/483; H01L 33/52; H01L 33/56; H01L 33/64; H01L 33/641; H01L 2924/1204; H01L 2924/12041; H01L 2924/181; H01L 2924/183; H01L 2924/186; H01L 2924/0665; H01L 2924/1579; H01L 2924/16176; H01L 2924/1659; H01L 2924/1679; H01L 31/0203; H01L 21/67376; H01L 21/76822; H01L 23/02; H01L 23/06; H01L 23/08; H01L 23/10; H01L 23/28; H01L 23/2931; H01L 29/3142; H01L 51/5237; H01L 51/524; H01L 51/5246; H01L 51/5024; H01L 2224/0519; H01L 2224/0539; H01L 2224/0549; H01L 2224/0569; H01L 2224/0589; H01L 2224/0599; H01L 2224/1319; H01L 2224/1339; H01L 2224/1349; H01L 2224/1369; H01L 2224/1389; H01L 2224/1399; H01L 2224/2919; H01L 2224/2939; H01L 2224/2949; H01L 2224/2969; H01L 2224/2989; H01L 2224/2999; H01L 2224/3719; H01L 2224/3739; H01L 2224/3749; H01L 2224/3769; H01L 2224/3789; H01L 2224/3799; H01L 2224/4519; H01L 2224/4539; H01L 2224/4549; H01L 2224/4569; H01L 2224/4589; H01L 2224/4599; H01L 2224/4869; H01L 2224/8049; H01L 2224/8069; H01L 2224/8079; H01L 2224/8085; H01L 2224/8149; H01L 2224/8169; H01L 2224/8179; H01L 2224/8185; H01L 2224/8285; H01L 2224/8349; H01L 2224/8369; H01L 2224/8379; H01L 2224/8385; H01L 2224/8449; H01L 2224/8469; H01L 2224/8479; H01L 2224/8485; H01L 2224/8549; H01L 2224/8569; H01L 2224/8579; H01L 2224/8585; H01L 2224/8685; H01L 21/67; H01L 21/67005; H01L 21/3142; H01L 2924/06; H01L 2924/078

USPC ............ 257/81, 99, 100, 433, 787, 788, 789, 257/795, 753, 782, 783, E23.127

See application file for complete search history.

(56) References Cited

U.S. PATENT DOCUMENTS

| | | |
|---|---|---|
| 2005/0129957 A1* | 6/2005 | Kashiwagi et al. ............ 428/413 |
| 2007/0213458 A1 | 9/2007 | Topoulos |
| 2009/0050925 A1* | 2/2009 | Kuramoto et al. ............ 257/100 |
| 2009/0146175 A1* | 6/2009 | Bahadur et al. ............... 257/100 |
| 2010/0291374 A1* | 11/2010 | Akarsu et al. ................. 428/328 |
| 2011/0031527 A1* | 2/2011 | Kotani et al. ................. 257/100 |
| 2011/0310622 A1 | 12/2011 | Topoulos |
| 2012/0228564 A1* | 9/2012 | Hashimoto et al. ........... 252/582 |
| 2012/0248495 A1* | 10/2012 | Umakoshi et al. .............. 257/99 |
| 2012/0262925 A1* | 10/2012 | Lu ............................ 362/296.02 |
| 2012/0273974 A1* | 11/2012 | Katogi et al. ................. 257/783 |
| 2013/0096253 A1* | 4/2013 | Tamada et al. ................ 524/588 |
| 2013/0158167 A1* | 6/2013 | Takenaka ...................... 523/456 |
| 2013/0158184 A1 | 6/2013 | Topoulos |
| 2015/0008455 A1* | 1/2015 | Tozawa et al. .................. 257/88 |

FOREIGN PATENT DOCUMENTS

| | | |
|---|---|---|
| JP | 53-136982 A | 11/1978 |
| JP | 2009-507990 A | 2/2009 |
| JP | 2010-270177 A | 12/2010 |

* cited by examiner

*Primary Examiner* — Teresa M Arroyo (74) *Attorney, Agent, or Firm* — McGinn IP Law Group, PLLC.

(57) ABSTRACT

The present invention provides a light emitting device, which includes a light emitting diode (LED) chip, a case formed of polycyclohexylene dimethylene terephthalate, and a sealant that is charged into the case to seal the LED chip. In the light emitting device, a stabilizer having a melting point that is higher than a junction temperature of the LED chip by 80° C. or more exists at a boundary surface between an inner wall surface of the case and the sealant or within 300 μm of the boundary surface.

20 Claims, 3 Drawing Sheets

Related Art

FIG. 3A2

Related Art

FIG. 3B1

Related Art

FIG. 3B2

Related Art

LIGHT-EMITTING DEVICE INCLUDING CASE AND SEALANT

TECHNICAL FIELD

The present invention relates to a light emitting device (an LED package) including a sealant that is charged into a resin case to seal an LED chip.

BACKGROUND ART

Figure 3A:
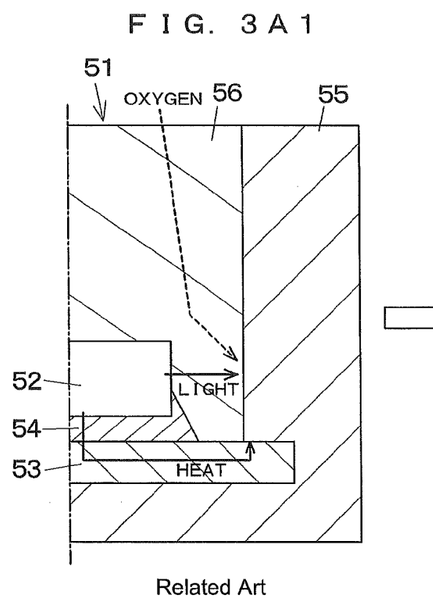
Figure 3A:
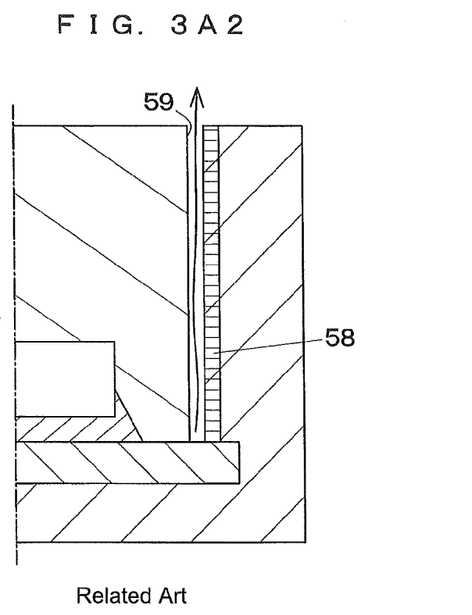

As a material of a case 55 of a light emitting device 51 (an LED package) illustrated in FIG. 3A1, conventionally, polyphthalamide (PPA), liquid crystal polymers, or other materials have been mainly used. In order for the case 55 to function also as a reflector, white dyes were contained in the case such that the case is formed into white with high reflectivity. However, PPA deteriorates due to heat and light from an LED chip 52, the intrusion of oxygen, or other factors, and, as illustrated in FIG. 3A2 as a browned part 58 represented by horizontal hatching, the white turns brown, thereby decreasing the reflectivity and hence decreasing luminous intensity of the package, and causing the end of life of the light emitting device 51.

In order to solve this browning, there is described the use of high heat-resistant polymers such as polycyclohexylene dimethylene terephthalate (PCT) as the material of the case in Patent Literatures 1 to 3.

Organic components of the case 55, a sealant 56, a die bond material 54, or other materials deteriorate due to heat, light, the intrusion of oxygen, or other factors. This deterioration may cause peeling at the boundary surface between the case 55 and the sealant 56 to form a gap 59, as illustrated in FIG. 3A2, whereby the reflective performance may decrease. However, because the deteriorated components are released outside the package through the gap 59, the deteriorated components themselves were less problematic.

CITATION LIST

Patent Literature

Patent Literature 1: Japanese Patent Application Publication No. S53-136982 (JP S53-136982 A)
Patent Literature 2: Japanese Translation of PCT International Application No. 2009-507990
Patent Literature 3: Japanese Patent Application Publication No. 2010-270177 (JP 2010-270177 A)

SUMMARY OF INVENTION

Technical Problem

Figure 3B:
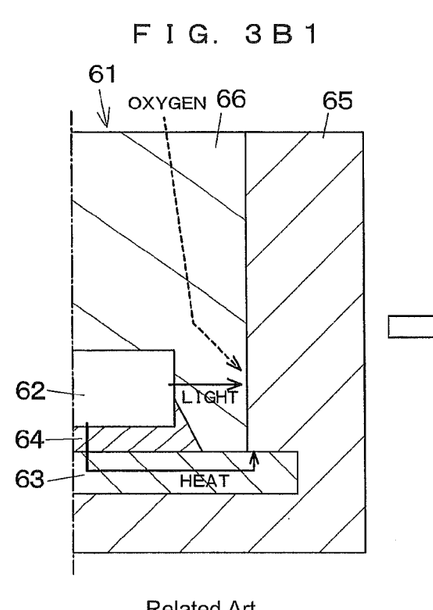

The inventors of the present invention tested a light emitting device 61 using a high heat-resistant polymer such as PCT in place of PPA as the material of a case 65, as illustrated in FIG. 3B1, and considered that this was able to eliminate the browning of the case 65, suppress a decrease in the luminous intensity of the package, and achieve an extended life.

Figure 3B:
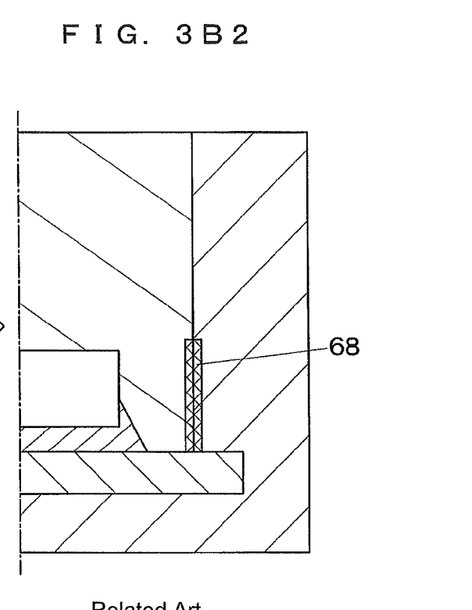

However, as a result of the test, it was confirmed that the simple replacement with the high heat-resistant polymer such as PCT did not enable an extended life. The reason for this is as follows. Also in this test example, the organic components of the case 65, a sealant 66, and a die bond material 64 deteriorate due to heat, light, the intrusion of oxygen, or other factors, but the case 65 made of the high heat-resistant polymer deteriorates less as compared to a conventional one, thereby creating no gap between the case 65 and the sealant 66. Because of this, the deteriorated components are then not released outside the package, are accumulated locally, and become carbonized (blackened), as illustrated in FIG. 3B2 as a blackened part 68 represented by cross hatching, thereby reducing the reflectivity.

Stabilizers may be added to PCT for preventing its decomposition, oxidization, discoloration, or the like. For PCT, a stabilizer with a melting point of about 100° C. is generally selected. The reason for this is as follows. Because PCT becomes decomposed beyond its melting point 290° C., a melt kneading temperature is desired to be lowered as much as possible. In such a situation, dispersing a stabilizer having a high melting point uniformly during melt kneading makes the control range of kneading temperature narrow. Accordingly, the use of the stabilizer having the high melting point is avoided.

Regarding this, the inventors of the present invention have found that when using PCT as the material of the case, the use of a stabilizer having a high melting point, which is not generally used for PCT, can reduce the blackening of the deteriorated components and concluded that the advantage of using the stabilized having a high melting point surpasses disadvantages of performing kneading temperature control strictly, and thus achieved the present invention.

Solution to Problem

An aspect of the present invention provides a light emitting device including an LED chip, a case formed of PCT, and a sealant that is charged into the case to seal the LED chip, in which a stabilizer having a melting point that is higher than a junction temperature of the LED chip by 80° C. or more exists at a boundary surface between an inner wall surface of the case and the sealant or within 300 µm of the boundary surface.

1. Stabilizer
1-1. Aspects of Existence of Stabilizer

Examples of an aspect in which the stabilizer exists at the boundary surface between the inner wall surface of the case and the sealant or within 300 µm of the boundary surface include, but not limited to in particular, the followings.

(a) An aspect in which the stabilizer is contained in the case to allow the stabilizer to exist at the boundary surface. In this case, the addition amount of the stabilizer is preferably 0.1% by mass to 3% by mass with respect to the amount of the material of the case.

(b) An aspect in which the stabilizer is contained in the sealant to allow the stabilizer to exist at the boundary surface. In this case, the addition amount of the stabilizer is preferably 0.1% by mass to 3% by mass with respect to the amount of the sealant.

(c) An aspect in which the stabilizer is contained in a die bond material for mounting LED chip to allow the stabilizer to exist within 300 µm of the boundary surface. In this case, the addition amount of the stabilizer is preferably 0.1% by mass to 20% by mass with respect to the amount of the die bond material, and more preferably 1% by mass to 10% by mass with respect to the amount of the die bond material.

(d) An aspect in which the stabilizer is allowed to adhere to the inner wall surface of the case to allow the stabilizer to exist at the boundary surface. In this case, the addition amount of the stabilizer is preferably 0.1% by mass to 3% by mass with respect to the amount of the sealant.

1-2. Examples of Stabilizer

Depending on the junction temperature of the LED chip, examples of a preferable stabilizer having a melting point that is higher than the junction temperature of the LED chip by 80° C. or more include the followings.

(1) A salt-like reaction product of a compound selected from the group of amine light stabilizers with steric hindrance (HALS compounds) and carboxylic acid or a derivative of carboxylic acid.

Nylostab S-EED (registered trademark, manufactured by Clariant (Japan) K.K.) melting point 272° C.

Its component is

N,N'-bis(2,2,6,6-tetramethyl-4-piperidinyl)-1,3-benzenedicarboxamide

Hostavin N20 (registered trademark, manufactured by Clariant (Japan) K.K.) melting point 225° C.

Hostavin N845PP (registered trademark, manufactured by Clariant (Japan) K.K.) melting point 28° C.

Hostavin NOW (registered trademark, manufactured by Clariant (Japan) K.K.) melting point—

Hostavin N24 (registered trademark, manufactured by Clariant (Japan) K.K.) melting point 16° C.

Hostavin N30 (registered trademark, manufactured by Clariant (Japan) K.K.) melting point 148° C.

Hostavin N321 (registered trademark, manufactured by Clariant (Japan) K.K.) melting point 58° C. to 70° C.

Hostavin PR-31 (registered trademark, manufactured by Clariant (Japan) K.K.) melting point 120° C. to 125° C.

(2) Hindered-phenol-based antioxidant

Irganox 3114 (registered trademark, manufactured by BASF Corporation) melting point 218° C.

Its component is tris-(3,5-di-t-butyl-4-hydroxybenzyl)-isocyanurate.

1-3. Addition Amount of Stabilizer

The addition amount of the stabilizer is preferably 0.1% by mass to 20% by mass.

2. Light Emitting Device and LED Chip

Examples of the type of the light emitting device (LED package) include, but not limited to in particular, the surface mount device (SMD) type and the chip-on-board (COB) type, and can be applied to various packages. Examples of the SMD include the top-view type and the side-view type. Examples of the LED chip to be used include the face-up type and the flip-chip type.

The junction temperature (Tj) of the LED chip is the temperature of the LED chip (technically, the temperature of its PN junction), and can be directly measured or estimated from a measured temperature in the vicinity of the LED chip based on a known empirical rule.

3. Case 3-1. Main Material of Case

For the material of the case, as described above, polycyclohexylene dimethylene terephthalate (PCT) is used. However, with PCT as the main component (the component having the highest addition ratio in terms of % by mass, preferably 50% by mass or more), other thermoplastic resins or thermoset resins maybe added thereto. Examples of the thermoplastic resins to be added include aromatic polyamide resins such as PA6T, PA9T, and PA10T, alicyclic polyamide resins, aliphatic polyamide resins, and liquid crystal polymers, and among them, alicyclic polyamide resins are preferable in view of resistance to heat discoloration. Examples of the thermoset resins to be added include silicone resins, modified silicone resins, epoxy resins, and modified epoxy resins.

3-2. Additives of Case

Examples of additives include reflective materials, photostabilizers (additional HALS compounds, UV absorbers, and excited state quenchers), phosphorous-based or sulfur-based processing stabilizers, antioxidants (phenol-based or amine-based), antistatic agents, nucleating agents, clearing media, flame retardants, reinforcing materials (for example, mineral filler, glass fiber, hollow glass spheres, carbon fiber, nano-scale reinforcing materials (for example, nano clay and carbon nanotubes)), lubricants, anti-blocking agents, and colorants (pigments and colorants). Preferably, the reflective material has nearly a spherical shape with a diameter of about 0.1 µm or more and 0.3 µm or less, and its content within the case resin composition is about 10% by weight or more and 50% by weight or less. Titanium oxide is preferably used. Zinc oxide, zirconium oxide, barium sulfate, zinc sulfate, and boron nitride may also be used.

4. Sealant

The sealant is preferably excellent in gas barrier properties in order to inhibit the corrosion of Ag plating on lead frames. Examples thereof that can be used include epoxy, modified silicone, phenyl silicone, dimethyl silicone, and silsesquioxane-containing silicone. Among them, modified silicone and phenyl silicone are preferable because they yellow less due to heat and light and are excellent in gas barrier properties.

The sealant may contain phosphors. Furthermore, the sealant may contain dispersants for dispersing the phosphors. The phosphors may be either dispersed or settled out. The sealant may also contain fillers, and the fillers are preferably materials that yellow less due to heat and light. Transparent fillers such as silica, silicone, glass beads, and glass fiber and white fillers such as titanium oxides and potassium titanate may be mixed. The filler shape maybe any of granular, spherical, scaly, rod-like, and fibrous ones. The filler is preferably excellent in heat resistance in view of the manufacturing conditions and performance of LED lamps, and more preferably can be used at 150° C. or more. The addition amount of the filler is not limited in particular. Examples of reflective materials of the sealant include a white filler and a filler having a different refractive index, and in view of heat resistance, light resistance, and reflectivity, titanium oxides and potassium titanate are preferable.

Member on which LED chip is mounted

Examples of a member on which the LED chip is mounted include, but not limited to in particular, lead frames and wiring patterns of print wiring boards. The heat of the LED chip is conveyed to the case and the sealant through the member.

Advantageous Effects of Invention

The light emitting device according to the present invention produces excellent effects of not only inhibiting the browning of the case, but also inhibiting the blackening of the deteriorated components of the organic components of the case, sealant, and die bond material, thereby suppressing a decrease in the luminous intensity of the package over the long term, achieving the extended life of the light emitting device, and enabling the package to operate at higher temperature.

BRIEF DESCRIPTION OF DRAWINGS

FIGS. 1A, 1B, and 1C illustrate a light emitting device according to embodiments, where

FIGS. 3A1 and 3A2 are sectional views of a light emitting device according to conventional examples, and FIGS. 3B1 and 3B2 are sectional views of a light emitting device at a study stage by the inventors of the present invention.

DESCRIPTION OF EMBODIMENTS

A light emitting device 1 includes an LED chip 2, a case 5 formed of PCT, and a sealant 6 that is charged into the case 5 and seals the LED chip 2, in which a stabilizer having a melting point that is higher than the junction temperature Tj of the LED chip 2 by 80° C. or more exists at the boundary surface between the inner wall surface of the case 5 and the sealant 6 or within 300 μm of the boundary surface.

EXAMPLES

Figure 1A:
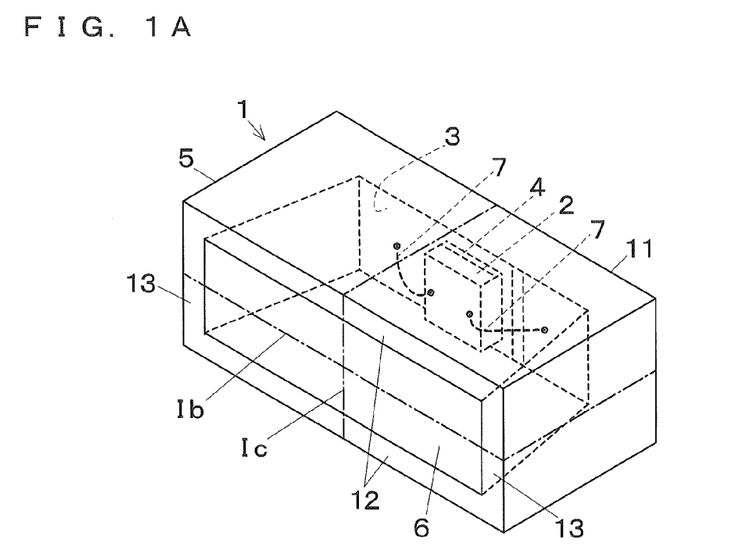
FIG. 1A is a perspective view of the light emitting device.
Figure 1B:
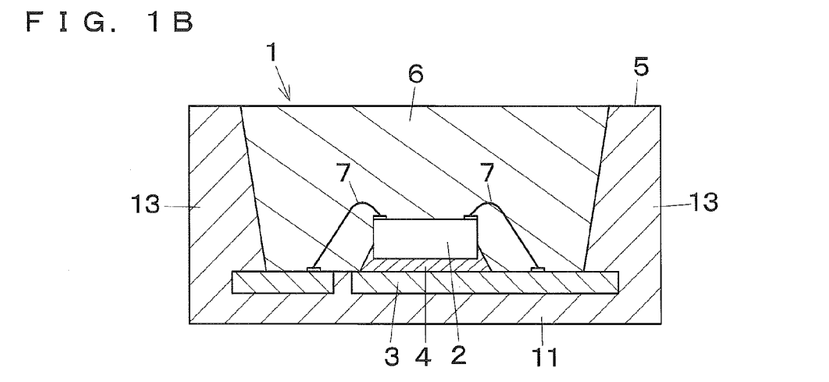
FIG. 1B is a sectional view taken along the line Ib in FIG. 1A.
Figure 1C:
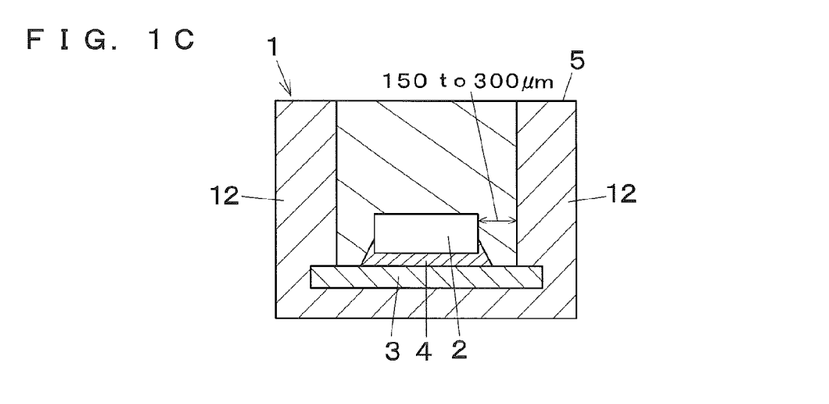
FIG. 1C is a sectional view taken along the line Ic in FIG. 1A.

The light emitting device 1 according to embodiments illustrated in FIGS. 1A to 1C is an example of a side-view type SMD including a face-up type LED chip, and includes the LED chip 2, a lead frame 3, a die bond material 4, the case 5, and the sealant 6. The case 5 includes a rectangular bottom 11, upper and lower long-side walls 12, and right and left short-side walls 13 and also functions as a reflector. The lead frame 3 is fixed to the bottom 11, and the ends of the lead frame 3 reach the base ends of the long-side walls 12 and the short-side walls 13. The LED chip 2 is mounted on the lead frame 3 via the die bond material 4 and is wire-bonded to the lead frame 3 via bonding wires 7. The sealant 6 is charged into the case 5 to seal the LED chip 2.

The heat of the LED chip 2 is then conveyed from the die bond material 4 to the base ends of the long-side walls 12 and the short-side walls 13 via the lead frame 3, thereby heating the long-side walls 12 and the short-side walls 13. The light of the LED chip 2 illuminates the long-side walls 12 and the short-side walls 13 via the sealant 6. The heat and light have a significant influence in particular on the inner wall surface parts of the base ends of the long-side walls 12 and the short-side walls 13, and the inner wall surface parts are parts at which concern about blackening is greatest. Given this situation, as will be described below, a predetermined stabilizer was used in a predetermined manner. In contrast to that the distance between the LED chip 2 and the short-side wall 13 is about 1 mm, the distance between the LED chip 2 and the long-side wall 12 is as extremely small as 150 μm to 300 μm (FIG. 1C). For this reason, it is considered that the influence of the heat and light is larger on the long-side walls 12 than on the short-side walls 13.

As the LED chip 2, blue-light emitting one (wavelength 450 nm) was used. Ag-plated Cu alloy 194 was used as the lead frame 3. An epoxy resin mixture was used as the die bond material 4. The junction temperature (Tj) of the LED chip 2 was 130° C., and the temperature at the inner wall surface parts of the base ends of the long-side walls 12 (the parts at which there is concern about blackening) at that time was also nearly 130° C.

PCT was used as the material of the case 5. A titanium oxide as a reflective material and glass fiber as a reinforcing material were mixed with PCT.

For the sealant 6, a modified silicone sealant selected as follows was used. With commercially available three types, that is, dimethyl silicone, phenyl silicone, and modified silicone as candidates, because the temperature at the parts at which there is concern about blackening is nearly 130° C. as described above, the spin-spin relaxation time of a 1H nucleus in an atmosphere of 120° C. was measured by pulsed nuclear magnetic resonance (NMR) to calculate an average time. The shorter the spin-spin relaxation time (the smaller the figure) is, the higher the gas barrier properties are. Dimethyl silicone was not selected because the relaxation time thereof is 1037 μS, and dimethyl silicone gives low gas barrier properties and may allow oxygen intrusion to discolor the Ag plating of the lead frame 3. Phenyl silicone was not selected because, although the relaxation time thereof is 89 μS and phenyl silicone gives high gas barrier properties, phenyl silicone has high viscosity, and is hard to be charged into the case. Modified silicone was selected because the relaxation time thereof is 432 μS, modified silicone gives high gas barrier properties, and its viscosity is appropriate.

A yellow phosphor as a phosphor was added to the sealant 6. The blue light of the LED chip 2 and the yellow light of the yellow phosphor are combined based on their complementary color relation, allowing white light to be taken out from the light emitting device 1.

The light emitting device 1 is manufactured by injecting the sealant 6 into the case 5 to which the lead frame 3 on which the LED chip 2 is mounted is fixed, and then curing the sealant 6 with a predetermined temperature and time.

In the embodiments, a stabilizer exists at the boundary surface between the inner wall surface of the case 5 and the sealant 6 or within 300 μm of the boundary surface. As the stabilizer, the seven types shown in the next Table 1 were used. The stabilizers are all powders. The reflectivity of blue light (wavelength 450 nm) and the reflectivity of ultraviolet light (wavelength 400 nm) measured in the form of a powder are also shown in Table 1.

Figure 2A:
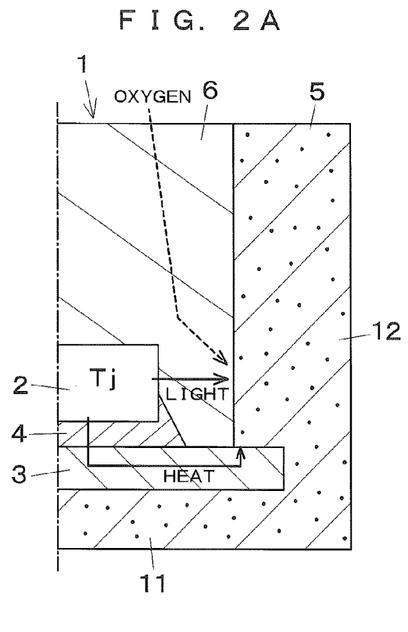
FIG. 2A is a sectional view of a light emitting device according to a first embodiment.
Figure 2B:
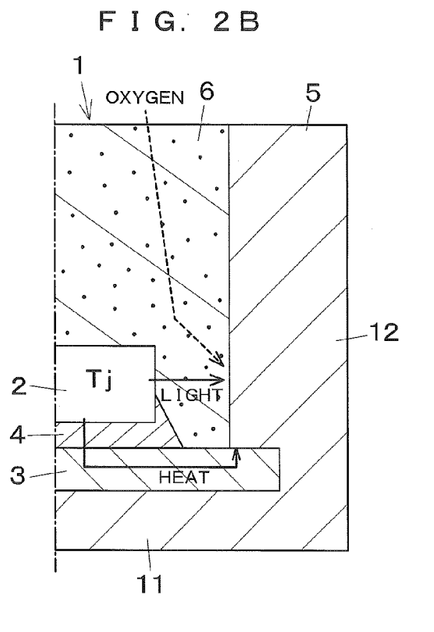
FIG. 2B is a sectional view of a light emitting device according to a second embodiment.
Figure 2C:
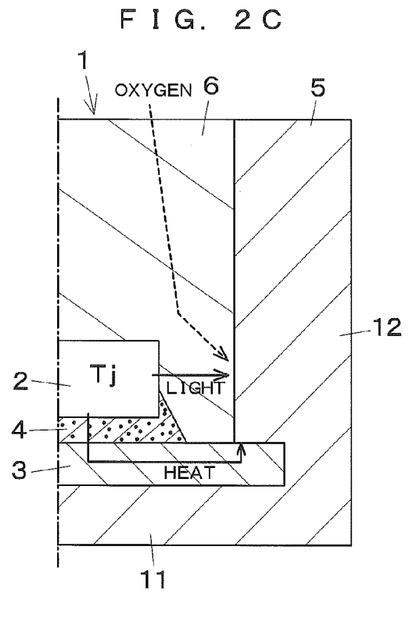
FIG. 2C is a sectional view of a light emitting device according to a third embodiment.
Figure 2D:
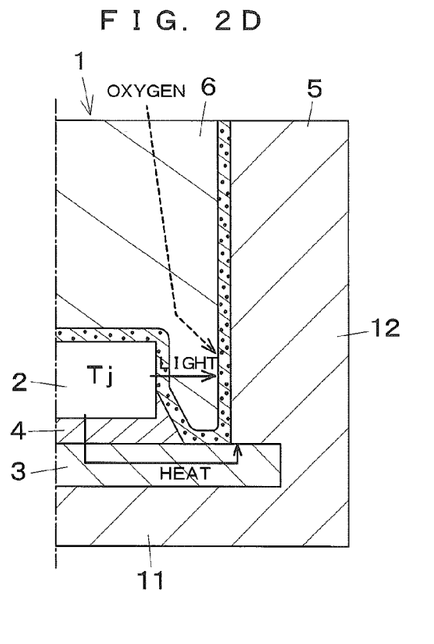
FIG. 2D is a sectional view of a light emitting device according to a fourth embodiment.

With regard to the forms of the stabilizer, four forms illustrated in FIGS. 2A to 2D are considered. In FIGS. 2A to 2D, the stabilizer is illustrated by "dots" for convenience. FIG. 2A shows a form in which the stabilizer is contained in the case 5 to allow the stabilizer to exist at the boundary surface, FIG. 2B shows a form in which the stabilizer is contained in the sealant 6 to allow the stabilizer to exist at the boundary surface, FIG. 2C shows a form in which the stabilizer is contained in the die bond material 4 to allow the stabilizer to exist within 300 μm of the boundary surface, and FIG. 2D shows a form in which the stabilizer is allowed to adhere to the inner wall surface of the case 5 to allow the stabilizer to exist at the boundary surface.

Among these forms, FIG. 2B was embodied. Forms in which each of the above seven types of stabilizers is contained in the sealant 6 in an amount of 1% by mass with respect to the amount of the sealant, were tested. The results are shown in test result 1 in Table 1. Further, FIG. 2D was embodied. Tested were forms in which the stabilizer dispersed in ethanol is fully injected into the inside of the case 5, the ethanol is volatilized at 70° C., resulting in the adhesion of the stabilizer in an amount of 1% by mass with respect to the amount of the sealant to the inner wall surface and other surfaces of the case 5, and then the sealant 6 is charged into the case 5. The results are shown in test result 2 in Table 1. In these test results 1 and 2, with regard to a luminous intensity maintenance rate (%) at 250 hours of a package continuous-current test, 80% or more was evaluated to be A, 60% or more to less than 80% was evaluated to be B, and less than 60% was evaluated to be C. In addition, FIG. 2C was embodied. The form in which the stabilizer of No. 7 is contained in the die bond material 4 in an amount of 6% by mass with respect to the amount of the die bond material, was tested. The result is shown in test result 3 in Table 1. In this test result 3, with regard to a luminous intensity maintenance rate (%) at 500 hours of a package continuous-current test, a luminous intensity maintenance rate (%) when adding no stabilizer anywhere was used as a reference (C evaluation), and higher rate than the reference was evaluated to be A.

TABLE 1

| No. | Stabilizer Product name | Manufacturer | Melting Point | Chemical name | Reflectivity of powder (%) 400 nm | Reflectivity of powder (%) 450 nm | Test result 1 Contained in sealant | Test result 2 Adhesion to inner wall surface of case | Test result 3 Contained in die bond material |
|---|---|---|---|---|---|---|---|---|---|
| 1 | Mark AO-412S | Adeka Argus Chemical Co., Ltd. | 50° C. | Pentaerythritol tetra (lauryl thiopropionate) | — | — | C C: Blackening of Ag plating also occurs | No experiment | No experiment |
| 2 | BHT | Lanxess Corporation | 70° C. | Dibutyl hydroxy toluene | 79% | 78% | C | C | — No experiment |
| 3 | Adeka Stab AO-80 | Adeka Corporation | 110° C. or more | 3,9-Bis[2-[3-(3-tert-butyl-4-hydroxy 5-methylphenyl)propionyloxy]-1,1-dimethylethyl]-2,4,8,10-tetraoxaspiro[5.5] undecane | 88% | 89% | C | C | — No experiment |
| 4 | Irganox 1010 | BASF Corporation | 110° C. to 125° C. | Pentaerythrityl tetrakis[3-(3,5-di-tert-butyl-4-hydroxyphenyl)propionate] | 75% | 82% | C | C | — No experiment |
| 5 | Irganox 1098 | BASF Corporation | 156° C. to 161° C. | N,N'-bis[3-(3',5'-di-tert-butyl-4'-hydroxyphenyl)propionyl] hexamethylenediamine | — | — | C | C | — No experiment |
| 6 | Irganox 3114 | BASF Corporation | 218° C. to 223° C. | tris-(3,5-di-t-butyl-4-hydroxy-benzyl)-isocyanurate | 90% | 89% | B Effective | A Effective | — No experiment |
| 7 | Nylostab S-EED | Clariant (Japan) K.K. | 272° C. | N,N'-bis(2,2,6,6-tetramethyl-4-piperidinyl)-1,3-benzene-dicarboxamide | 77% | 94% | A Effective | A Effective | A Effective |
| | | | | No Stabilizer added | — | — | C | C | C |

| No. | Structural Formula of Stabilizer |
|---|---|
| 1 |  |
| 2 |  |
| 3 |  |

TABLE 1-continued

| 4 |  |
| --- | --- |
| 5 | hindered-phenol-based  |
| 6 |  |

TABLE 1-continued

| 7 |  |

Table 1 reveals the followings.

(1) The stabilizers having melting points that are higher than the junction temperature (Tj) of the LED chip 2 of 130° C. by 80° C. or more (No. 6 and No. 7) exhibit high luminous intensity maintenance rates, and are favorable.

(2) The hindered-amine-based stabilizer (No. 7) in particular exhibits a high luminous intensity maintenance rate, and is favorable. The piperidine structure is considered to be preferable.

(3) With regard to the reflectivity measured in the form of a powder, higher reflectivity for the blue light (450 nm) is favorable, and lower reflectivity for the ultraviolet light (400 nm) is favorable.

The light emitting device according to the embodiments containing the stabilizers (No. 6 or No. 7) not only inhibits the browning of the case 5 but also inhibits the blackening of the deteriorated components of the organic components of the case 5, the sealant 6, and the die bond material 4, thereby suppressing a decrease in the luminous intensity of the package over the long term and achieving the extended life of the light emitting device. Furthermore, because the browning and blackening that are likely to occur at high temperatures can be inhibited, the package can operate at higher temperature.

The present invention is not limited to the above embodiments and can be embodied with modifications as needed without departing from the spirit of the present invention.

REFERENCE SIGNS LIST 1 light emitting device
2 LED chip
3 lead frame
4 die bond material
5 case
6 sealant
7 bonding wire
11 bottom
12 long-side wall
13 short-side wall

The invention claimed is:

1. A light emitting device comprising:
a light emitting diode (LED) chip;
a case formed of polycyclohexylene dimethylene terephthalate; and
a sealant disposed in the case to seal the LED chip,
wherein a stabilizer having a melting point that is higher than a junction temperature of the LED chip by 80° C. or more and is not higher than 290° C., which is a melting point of the polycyclohexylene dimethylene terephthalate, is disposed at a boundary surface between an inner wall surface of the case and the sealant or within 300 μm of the boundary surface.

2. The light emitting device according to claim 1, wherein the stabilizer is contained in the case such that the stabilizer is disposed at the boundary surface.

3. The light emitting device according to claim 1, wherein the stabilizer is contained in the sealant such that the stabilizer is disposed at the boundary surface.

4. The light emitting device according to claim 1, wherein the stabilizer is contained in a die bond material for mounting the LED chip such that the stabilizer is disposed within 300 μm of the boundary surface.

5. The light emitting device according to claim 1, wherein the stabilizer adheres to the inner wall surface of the case such that the stabilizer is disposed at the boundary surface.

6. The light emitting device according to claim 1, wherein the stabilizer comprises N,N'-bis(2,2,6,6-tetramethyl-4-piperidinyl)-1,3-benzenedicarboxamide.

7. The light emitting device according to claim 1, wherein the stabilizer comprises tris-(3,5-di-t-butyl-4-hydroxybenzyl)-isocyanurate.

8. The light emitting device according to claim 1, wherein an amount of the stabilizer with respect to an amount of a material of the case is in a range from 0.1% by mass to 3% by mass.

9. The light emitting device according to claim 8, wherein an amount of the stabilizer with respect to an amount of the sealant is in a range from 0.1% by mass to 3% by mass.

10. The light emitting device according to claim 9, wherein the stabilizer is contained in a die bond material for mounting the LED chip, and wherein an amount of the stabilizer with respect to an amount of the die bond material is in a range from 0.1% by mass to 20% by mass.

11. The light emitting device according to claim 1, wherein an amount of the stabilizer with respect to an amount of the sealant is in a range from 0.1% by mass to 3% by mass.

12. The light emitting device according to claim 1, wherein the stabilizer is contained in a die bond material for mounting the LED chip, and wherein an amount of the stabilizer with respect to an amount of the die bond material is in a range from 0.1% by mass to 20% by mass.

13. The light emitting device according to claim 1, wherein the stabilizer is contained in a die bond material for mounting the LED chip, and wherein an amount of the stabilizer with respect to an amount of the die bond material is in a range from 0.1% by mass to 10% by mass.

14. The light emitting device according to claim 1, wherein the polycyclohexylene dimethylene terephthalate is a main component of the case with respect to a remaining material of the case.

15. The light emitting device according to claim 1, wherein an amount of the polycyclohexylene dimethylene terephthalate in the case is least 50% by mass.

16. The light emitting device according to claim 1, wherein the sealant comprises phosphors.

17. The light emitting device according to claim 1, wherein the case further comprises titanium oxide as a reflective material and a glass fiber as a reinforcing material.

18. The light emitting device according to claim 1, wherein the melting point of the stabilizer is in a range from 218° C. to 223° C.

19. The light emitting device according to claim 1, wherein the junction temperature of the LED chip is 130° C.

20. The light emitting device according to claim 1, wherein the stabilizer comprises a hindered-amine-based stabilizer.

* * * * *